(12) United States Patent
Fujikawa

(10) Patent No.: US 11,814,749 B2
(45) Date of Patent: Nov. 14, 2023

(54) SINGLE CRYSTAL GROWTH CRUCIBLE AND SINGLE CRYSTAL GROWTH METHOD

(71) Applicant: SHOWA DENKO K.K., Tokyo (JP)

(72) Inventor: Yohei Fujikawa, Hikone (JP)

(73) Assignee: Resonac Corporation, Tokyo (JP)

(*) Notice: Subject to any disclaimer, the term of this patent is extended or adjusted under 35 U.S.C. 154(b) by 58 days.

(21) Appl. No.: 16/559,863

(22) Filed: Sep. 4, 2019

(65) Prior Publication Data
US 2020/0080233 A1 Mar. 12, 2020

(30) Foreign Application Priority Data
Sep. 6, 2018 (JP) .................. 2018-167062

(51) Int. Cl.
*C30B 35/00* (2006.01)
*C30B 23/06* (2006.01)
*C30B 23/02* (2006.01)

(52) U.S. Cl.
CPC .......... *C30B 35/002* (2013.01); *C30B 23/025* (2013.01); *C30B 23/066* (2013.01); *C30B 35/007* (2013.01)

(58) Field of Classification Search
CPC ..... C30B 23/02; C30B 23/025; C30B 23/066; C30B 29/36; C30B 35/002; C30B 35/007
See application file for complete search history.

(56) References Cited

U.S. PATENT DOCUMENTS

2001/0004877 A1 6/2001 Shigeto et al.
2020/0080229 A1 3/2020 Fujikawa

FOREIGN PATENT DOCUMENTS

| CN | 1554808 A | 12/2004 |
|---|---|---|
| CN | 104246023 A | 12/2014 |
| CN | 105734671 A | 7/2016 |
| CN | 105734671 A * | 7/2016 |
| CN | 207498521 U | 6/2018 |

(Continued)

OTHER PUBLICATIONS

Communication dated Jan. 7, 2021, from the China National Intellectual Property Administration in application No. 201910772738.2.

(Continued)

*Primary Examiner* — Hua Qi
(74) *Attorney, Agent, or Firm* — Sughrue Mion, PLLC

(57) ABSTRACT

The present invention provides a single crystal growth crucible and a single crystal growth method which can suppress the recrystallization of the raw material gas which has been sublimated on the surface of the raw material and can suppress the generation of different polytypes in single crystal growth. The single crystal growth crucible includes an inner bottom, a crystal mounting part, and a deposition preventing member, wherein a raw material is provided in the inner bottom, the crystal mounting part faces the inner bottom, the deposition preventing member has a first surface comprising metal carbide, a first surface is disposed to face the crystal mounting part, the deposition preventing member is disposed in a central area of the inner bottom in a plan view from the crystal mounting part, and the first surface is disposed in accordance with the position of the surface of the raw material.

7 Claims, 7 Drawing Sheets

(56) References Cited

FOREIGN PATENT DOCUMENTS

| | | | | |
|---|---|---|---|---|
| JP | 06-001698 A | | 1/1994 | |
| JP | 08295595 A | * | 11/1996 | |
| JP | 11-268990 A | | 10/1999 | |
| JP | 2000264795 A | * | 9/2000 | |
| JP | 2006069851 A | * | 3/2006 | |
| JP | 2009-091173 A | | 4/2009 | |
| JP | 2010-275166 A | | 12/2010 | |
| JP | 2011178590 A | * | 9/2011 | ............ C30B 23/06 |
| JP | 2012020893 A | * | 2/2012 | |
| JP | 2015-212207 A | | 11/2015 | |
| JP | 2015212207 A | * | 11/2015 | |
| TW | 201504488 A | | 2/2015 | |
| WO | 2019/171901 A1 | | 9/2019 | |

OTHER PUBLICATIONS

A. Pisch, et al. publication entitled "Evaporation behavior of SiC powder for single crystal growth—an experimental study on thermodynamics and kinetics," Materials Science Forum, vol. 338-342, pp. 91-94 (2000) (1 page total).

Office Action dated Dec. 30, 2020 from the China National Intellectual Property Administration in related Chinese Application No. 201910751559.0.

Non-Final Office Action dated Feb. 8, 2021 in related U.S. Appl. No. 16/559,875.

Office Action dated May 17, 2022 in Japanese Application No. 2018-167062.

\* cited by examiner

SINGLE CRYSTAL GROWTH CRUCIBLE AND SINGLE CRYSTAL GROWTH METHOD

BACKGROUND OF THE INVENTION

Field of the Invention

The present invention relates to a single crystal growth crucible and a single crystal growth method.

Priority is claimed on Japanese Patent Application No. 2018-167062, filed Sep. 6, 2018, the content of which is incorporated herein by reference.

Description of Related Art

Silicon carbide (SiC) has a dielectric breakdown electric field that is an order of magnitude larger than that of silicon (Si), and has a band gap that is three times as wide as that of silicon (Si). In addition, silicon carbide (SiC) has a thermal conductivity that is about three times higher than silicon (Si). As a result, silicon carbide (SiC) is expected to be applied to power devices, high frequency devices, high temperature operation devices, and the like.

For devices such as semiconductors, a SiC epitaxial wafer in which an epitaxial film is formed on a SiC wafer is used. An epitaxial film provided by chemical vapor deposition (CVD) on a SiC wafer is an active area of the SiC semiconductor device. The SiC wafer is obtained by processing a SiC ingot.

The SiC ingot can be produced by a method such as a sublimation recrystallization method (hereinafter referred to as a sublimation method). The sublimation method is a method of obtaining a large single crystal by recrystallizing a raw material gas sublimated from a raw material on a seed crystal. In order to obtain a high quality SiC ingot, a method for suppressing defects and different polytypes (in which crystals of different polytypes are mixed) is required.

Patent Document 1 discloses a method of controlling the ratio of C to Si (C/Si ratio) of the source gas on the crystal growth surface and suppressing defects and different polytypes by adding a Si source to the surface of the SiC source.

Patent Document

[Patent Document 1] Japanese Unexamined Patent Application, First Publication No. 2010-275166

SUMMARY OF THE INVENTION

However, different polytypes may be contained in a grown single crystalline, and a method capable of further suppressing the different polytypes is desired.

The present invention has been made in view of the above problems, and it is possible to suppress the recrystallization of the raw material gas subjected to sublimation from being recrystallized on the surface of the raw material, and to suppress the generation of different polytypes in a single crystal to be grown. It is an object of the present invention to provide a single crystal growth crucible and a single crystal growth method.

The present inventors have found that when a deposition is generated on the surface of the raw material after crystal growth, different polytypes are likely to occur in the grown single crystal. The deposition is generated in a central area of which the temperature is relatively low, and part of the sublimated source gas is considered to be recrystallized using the source powder as nuclei. Therefore, covering the central area with metal carbide was studied. In the central area of the raw material, the deposition is likely to be generated. And in addition, the metal carbide is hard to adsorb and form SiC. As a result, it has been found that it is possible to suppress the nucleus growth of a part of the source gas, and to suppress the generation of deposition, and to suppress the generation of different polytypes in the single crystal to be grown.

That is, the present invention provides the following means in order to solve the above problems.

(1) A single crystal growth crucible according to the first aspect comprises an inner bottom,
a crystal mounting part, and
a deposition preventing member,
wherein a raw material is provided in the inner bottom,
the crystal mounting part faces the inner bottom,
the deposition preventing member has a first surface comprising metal carbide,
the first surface is disposed to face the crystal mounting part,
the deposition preventing member is disposed in a central area of the inner bottom in a plan view from the crystal mounting part,
the central area has a similar shape as a cross section of the inner bottom at a position of the surface of the raw material in a plan view from the crystal mounting part, and the central area is an area of 20 area % of a cross sectional area of the cross section from a center, (2) In the single crystal growth crucible according to the above aspect, the first surface on the crystal mounting part side of the deposition preventing member is in a range within 20 mm from the surface of the raw material provided in the inner bottom.

(3) In the single crystal growth crucible according to the above aspect, the deposition preventing member is a member mounted on the raw material after the raw material is provided in the inner bottom.

(4) In the single crystal growth crucible according to the above aspect, the deposition preventing member comprises a support on a second surface opposite to the first surface on the crystal mounting part side, and the support separates the surface of the raw material which is provided in the inner bottom from the second surface.

(5) in the single crystal growth crucible according to the above aspect, the deposition preventing member is connected to the inner bottom.

(6) In the single crystal growth crucible according to the above aspect, a surface of the deposition preventing member on the crystal mounting part side is covered with metal carbide.

(7) In the single crystal growth crucible according to the above aspect, the deposition preventing member is made of metal carbide.

(8) In the single crystal growth crucible according to the above aspect, the metal carbide is tantalum carbide.

(9) in the single crystal growth method according to the second aspect, in a single crystal growth crucible comprising an inner bottom for providing a raw material, and a crystal mounting part facing the inner bottom, the method comprises in the following order:
providing the raw material in the inner bottom;
covering a central area of the surface of the raw material with a deposition preventing member containing metal carbide on at least a surface on the side of the crystal mounting part in a plan view from the crystal mounting part; and growing a single crystal disposed in the crystal mounting part by sublimating the raw material by heating, wherein the central area is similar to a shape of a cross section of the inner bottom at a position of the surface of the raw material in a plan view from the crystal mounting part, and the central area is an area of 20 area % of a cross section area of the cross section from a center.

(10) In the covering step of the single crystal growth method according to the above aspect, a first surface on the crystal mounting part side of the deposition preventing member is mounted in a range within 20 mm from the surface of the raw material provided in the inner bottom.

(11) In the covering step of the single crystal growth apparatus according to the above aspect, a second surface of the deposition preventing member opposite to the first surface on the crystal mounting part is arranged to provide a space between the second surface and the surface of the raw material provided in the inner bottom.

(12) in the single crystal growth method according to the third aspect, in a single crystal growth crucible comprising an inner bottom for providing a raw material, and a crystal mounting part facing the inner bottom, the method comprises in the following order:

providing the raw material in the inner bottom, covering at least a surface on the side of the crystal mounting part with a deposition preventing member comprising metal carbide in an area of which the temperature is at least 15° C. lower than a maximum temperature of the surface of the raw material in a plan view from the crystal mounting part, and growing a single crystal disposed in the crystal mounting part by sublimating the raw material by heating.

According to the single crystal growth crucible and the single crystal growth method according to the above aspect, it is possible to suppress the recrystallization of the raw material gas subjected to sublimation from recrystallization on the surface of the raw material, and to suppress the generation of different polytypes in the single crystal to be grown.

DETAILED DESCRIPTION OF THE INVENTION

Figure 1:
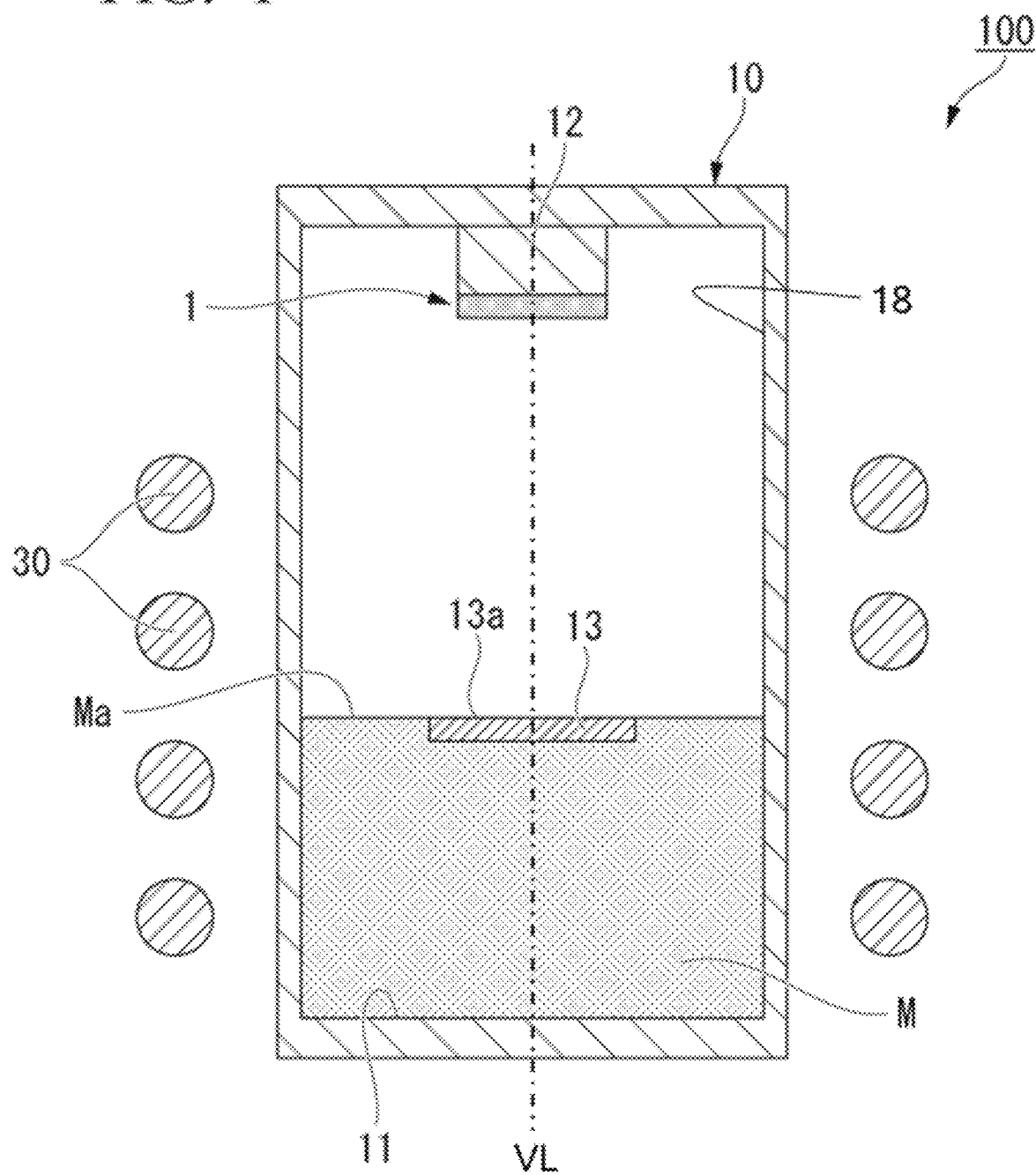
FIG. 1 is a schematic cross-sectional view of a single crystal growth apparatus according to the first embodiment.

Hereinafter, the present embodiment will be described in detail with reference to the drawings as appropriate. In the drawings used in the following description, for the sake of convenience, the characteristic parts may be shown as enlarged, and the dimensional ratio of each component may be different from the actual one. Materials, dimensions, or the like exemplified in the following description are merely examples, and the present invention is not limited to them and can be appropriately changed and implemented without changing the gist of the invention.

"Single Crystal Growth Crucible"

First Embodiment

FIG. 1 is a schematic cross-sectional view of a single crystal growth apparatus 100 according to the first embodiment. The single crystal growth apparatus 100 shown in FIG. 1 includes a crucible (single crystal growth crucible) 10 and a heating device 30.

FIG. 1 also illustrates the internal structure of the crucible 10 for ease of understanding, and includes a virtual line VL for this purpose.

The crucible 10 is a container surrounding an internal space. The crucible 10 includes an inner bottom 11 and a crystal mounting part 12 opposed to the inner bottom 11. A raw material M is provided in the inner bottom 11. A seed crystal 1 is mounted in the crystal mounting part 12. For example, the crystal mounting part 12 protrudes toward the raw material M cylindrically at a central position as viewed from the raw material M side. For the crystal mounting part 12, a carbon material such as graphite can be used.

The heating device 30 covers the outer periphery of the crucible 10. For example, a coil can be used as the heating device 30. When a current is supplied to the coil, an induced current is generated in the crucible 10, and as a result, the raw material M is heated.

The crucible 10 has a deposition preventing member 13 inside. The deposition preventing member 13 shown in FIG. 1 is a member disposed on the raw material M after the raw material is provided in the inner bottom 11. The deposition preventing member 13 shown in FIG. 1 is a plate-like member made of metal carbide. Examples of the metal carbide include a transition metal carbide such as tantalum carbide (TaC), tungsten carbide (WC), niobium carbide (NbC), molybdenum carbide (MoC), hafnium carbide (HfC) and the like. These materials are excellent in heat resistance. Moreover, these materials are materials in which SiC is not easily adsorbed and generated, and are materials which are less likely to cause recrystallization.

The deposition preventing member 13 covers the central area of the inner bottom 11 in a plan view from the crystal mounting part 12. When the raw material M is provided in the inner bottom 11, the deposition preventing member 13 covers the central area of the raw material M.

The central area resembles the shape of the cross section at the position of the surface Ma of the raw material M in a plan view from the crystal mounting part 12. And it is an area of 20 area % of the cross sectional area of the cross section at the position of the surface Ma of the raw material M from the center. Here, the shape of the cross section is a cross-sectional shape of the inner peripheral surface 18 of the crucible 10. When the inner diameter of the crucible 10 does not significantly change in the height direction and the cross section at the position of the surface Ma of the raw material M cannot be defined, the cross section may be replaced with the inner bottom.

It is possible to obtain a larger deposition preventing effect by using a larger size of the deposition preventing member 13. On the other hand, when the size of the deposition preventing member 13 is too large, the flow of the sublimation gas to the side of the seed crystal may be inhibited.

It is preferable to select a size of the deposition preventing member 13 to be used appropriately. In the raw material surface Ma, if an area of which the temperature is at least 20° C. lower than the maximum temperature in the raw material surface is formed, the deposition is easily generated on the raw material surface Ma. It is desirable that the deposition preventing member 13 cover an area of which the temperature is at least 15° C. lower than the maximum temperature in the surface of the raw material.

The deposition preventing member 13 may cover a wider range than the central area. For example, the deposition preventing member 13 may cover an area of 50% or more of the inner diameter of the crucible 10 from the center at the position of the surface Ma of the raw material M, and the deposition preventing member 13 may cover an area of 80% or more of the inner diameter of the crucible 10 from the center at the position of the surface Ma of the raw material M.

The first surface 13*a* on the crystal mounting part 12 side of the deposition preventing member 13 shown in FIG. 1 is at the same height position as the material surface Ma of the material M. The first surface 13*a* does not necessarily have to be at the same height position as the raw material surface Ma, and is preferably in a range within 20 mm from the raw material surface Ma. Alternatively, it is preferable that the first surface 13*a* be in a range within 20% of the height of the distance from the raw material surface Ma to the surface of the seed crystal 1. The first surface 13*a* may be located above (the crystal mounting part 12 side) or below (the inner bottom part 11 side) the material surface Ma.

According to the single crystal growth crucible 100 according to the first embodiment, the source gas subjected to sublimation can be prevented from recrystallizing on the raw material surface Ma, and generation of different polytypes can be suppressed in the single crystal to be grown.

The crucible 10 is heated from the outside by the heating device 30, and the temperature in the central area of the crucible 10 is lower than the outside. Sublimation of the raw material M contained in the crucible 10 mainly occurs in the outer peripheral area of the crucible 10. The outer peripheral area means an area inside the crucible 10 and outside the central area. When the deposition preventing member 13 is not present, part of the source gas sublimated in the outer peripheral area grows crystals by using the source particles located in the central area as nuclei. The crystals, which are obtained by recrystallization using the raw material particles as the nucleus, remain as deposition on the raw material surface after crystal growth. In order to stably grow the single crystal, it is necessary to stabilize the Si/C ratio of the sublimation gas in the growth space. The deposition phenomenon of the raw material surface is considered to destabilize this Si/C ratio and cause the generation of different polytypes.

On the other hand, when the deposition preventing member 13 covers the central area of the raw material M, the generation of the depositions is suppressed. The deposition preventing member 13 shown in FIG. 1 is a plate-like member, and even if the sublimation gas reaches the central area, there are no nuclei to be used for recrystallization. Further, the deposition preventing member 13 is made of metal carbide which is difficult to adsorb and generate SiC. Therefore, recrystallization of the source gas subjected to sublimation on the deposition preventing member 13 is also suppressed. In other words, the single crystal growth crucible 100 according to the first embodiment suppresses the generation of deposition, and suppresses the generation of different polytypes in the single crystal to be grown.

Second Embodiment

Figure 2:
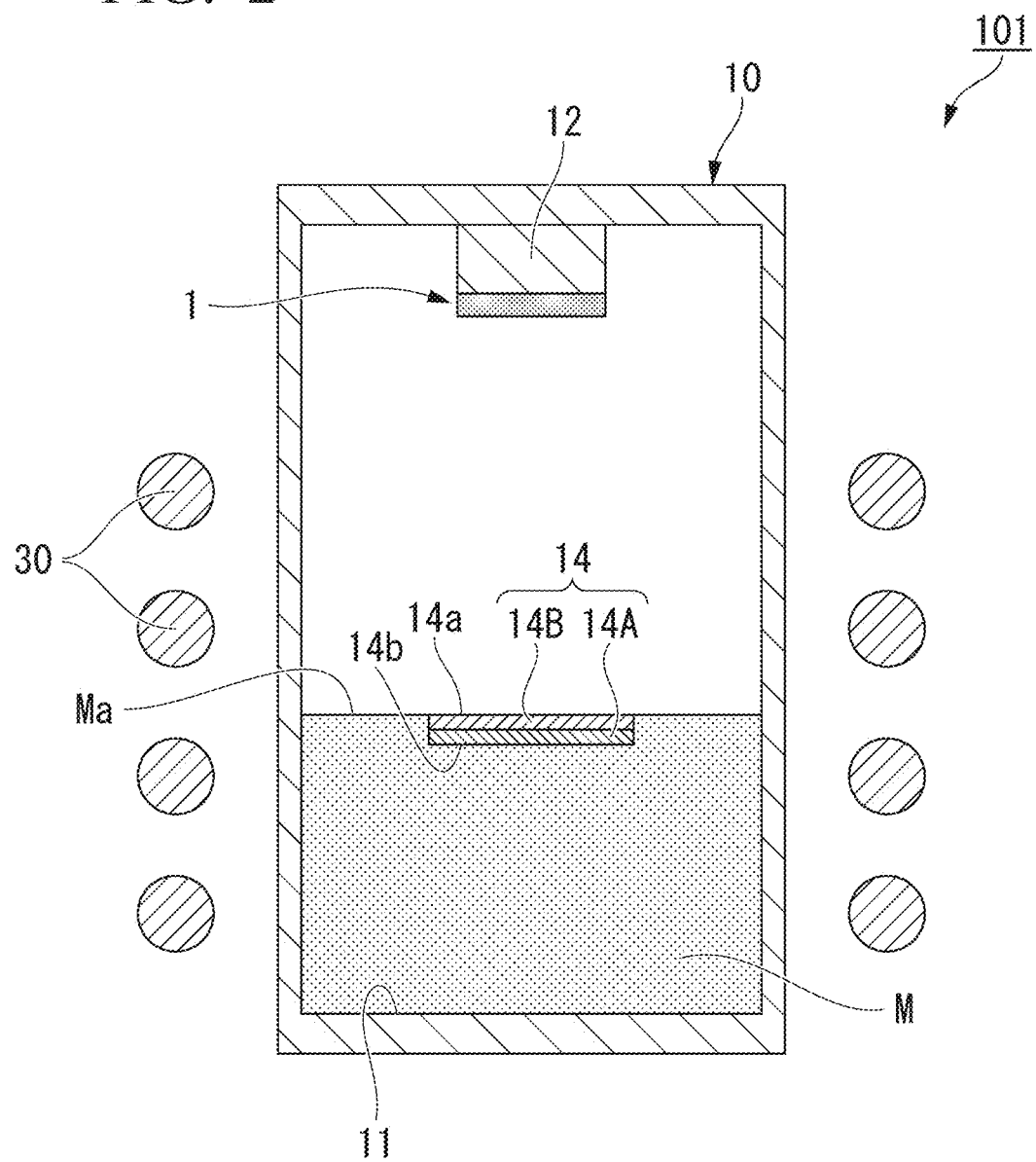
FIG. 2 is a schematic cross-sectional view of a single crystal growth apparatus according to the second embodiment.

FIG. 2 is a schematic cross-sectional view of the single crystal growth apparatus 101 according to the second embodiment. The apparatus 101 for growing a single crystal shown in FIG. 2 is different from the apparatus 100 for growing a single crystal shown in FIG. 1 in the structure of the deposition preventing member 14. The other configurations are the same, and the description thereof is omitted.

The deposition preventing member 14 illustrated in FIG. 2 is a member disposed on the raw material M after the raw material is provided in the inner bottom 11. The deposition preventing member 14 covers the central area of the inner bottom 11 in a plan view from the crystal mounting part 12. When the raw material M is provided in the inner bottom 11, the deposition preventing member 14 covers the central area of the raw material M. The deposition preventing member 14 may cover a wider range than the central area.

The first surface 14*a* on the crystal mounting part 12 side of the deposition preventing member 14 shown in FIG. 2 is at the same height position as the raw material surface Ma of the raw material M. The first surface 14*a* does not necessarily have to be at the same height position as the raw material surface Ma, and is preferably in a range within 20 mm from the raw material surface Ma. Alternatively, it is preferable that the first surface 14*a* be in a range within 20% of the height of the distance from the raw material surface Ma to the surface of the seed crystal 1.

The deposition preventing member 14 shown in FIG. 2 includes a base 14A and a surface layer 14B. The surface layer 14B covers at least the surface of the base 14A on the side of the crystal mounting part 12.

The base 14A is not particularly limited as long as it has heat resistance to the single crystal growth temperature. For example, graphite or the like can be used. The surface layer 14B may be made of metal carbide. The surface layer 14B may be a coating film formed on the surface of the base 14A, or may be a metal carbide powder mounted on the surface of the base 14A. The same metal carbide as that of the first embodiment can be used.

Since the surface layer 14B is provided, at least the first surface 14*a* on the crystal mounting part 12 side of the deposition preventing member 14 is made of metal carbide. In the second surface 14*b* opposed to the first surface 14*a* of the deposition preventing member 14, the depositions are not deposited. Therefore, if the first surface 14*a* is made of metal carbide, recrystallization of the source gas subjected to sublimation on the deposition preventing member 14 can be suppressed. That is, the apparatus 101 for growing the single crystal according to the second embodiment suppresses the generation of depositions, and suppresses the generation of different polytypes in the single crystal to be grown.

It is difficult to make a sheet member made of metal carbide with a large size. For example, when graphite is used for the base 14A, enlargement of the size is facilitated. Although metal carbide is expensive, the cost can be reduced if only the surface layer 14B is made of metal carbide.

Third Embodiment

Figure 3:
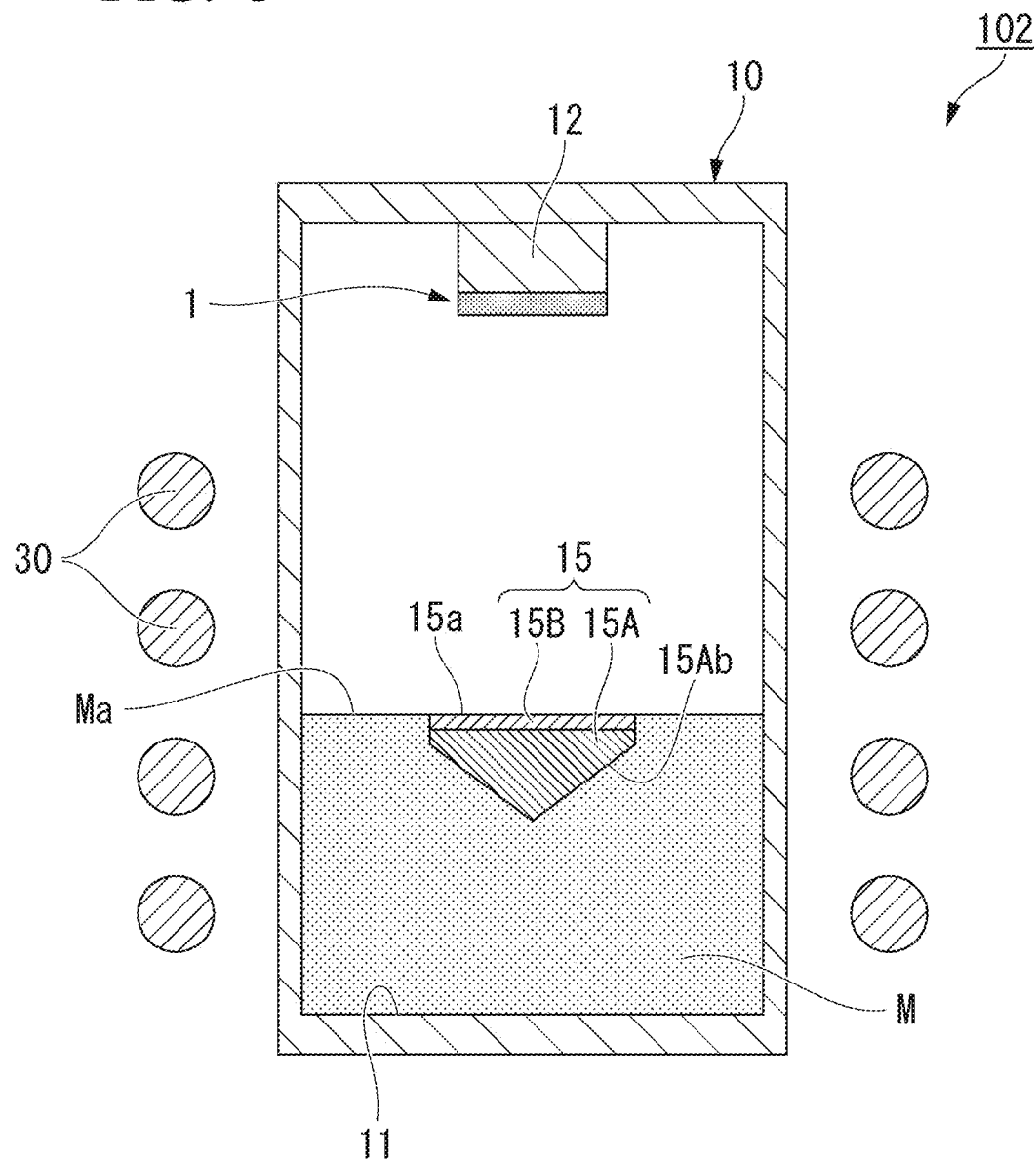
FIG. 3 is a schematic cross-sectional view of a single crystal growth apparatus according to the third embodiment.

FIG. 3 is a schematic cross-sectional view of the single crystal growth apparatus 102 according to the third embodiment. The single crystal growth apparatus 102 shown in FIG. 3 is different from the apparatus 100 for growing a single crystal shown in FIG. 1 in the structure of the deposition preventing member 15. The other configurations are the same, and the description thereof is omitted.

The deposition preventing member 15 shown in FIG. 3 is a member mounted on the raw material M after the raw material is provided in the inner bottom 11. The deposition preventing member 15 covers the central area of the inner bottom 11 in a plan view from the crystal mounting part 12. When the raw material M is provided in the inner bottom 11, the deposition preventing member 15 covers the central area of the raw material M. The deposition preventing member 15 may cover a wider range than the central area.

The first surface 15a on the crystal mounting part 12 side of the deposition preventing member 15 shown in FIG. 3 is at the same height position as the raw material surface Ma of the raw material M. The first surface 15a does not necessarily have to be at the same height position as the raw material surface Ma, and is preferably in a range within 20 mm from the raw material surface Ma. Alternatively, it is preferable that the first surface 15a be in a range within 20% of the height of the distance from the raw material surface Ma to the surface of the seed crystal 1.

The deposition preventing member 15 shown in FIG. 3 includes a base 15A and a surface layer 15B. The surface layer 15B covers at least the surface of the substrate 15A on the side of the crystal mounting part 12. The deposition preventing member 15 differs from the deposition preventing member 14 shown in FIG. 2 only in the shapes of the base materials 14A and 15A. Since the first surface 15a is made of metal carbide, recrystallization of the source gas subjected to sublimation on the deposition preventing member 15 can be suppressed.

The lower surface 15Ab on the inner bottom 11 side of the base 15A is in the shape of a cone whose diameter decreases toward the inner bottom 11. When the lower surface 15Ab is an inclined surface which spreads toward the outer peripheral area, the source gas sublimated from the source M located below the deposition preventing member 15 can be guided to the outside of the crucible 10 where the source M is exposed. By preventing the stagnation of the raw material gas subjected to sublimation, it is possible to suppress recrystallization of the raw material at a position below the deposition preventing member 15.

Fourth Embodiment

Figure 4:
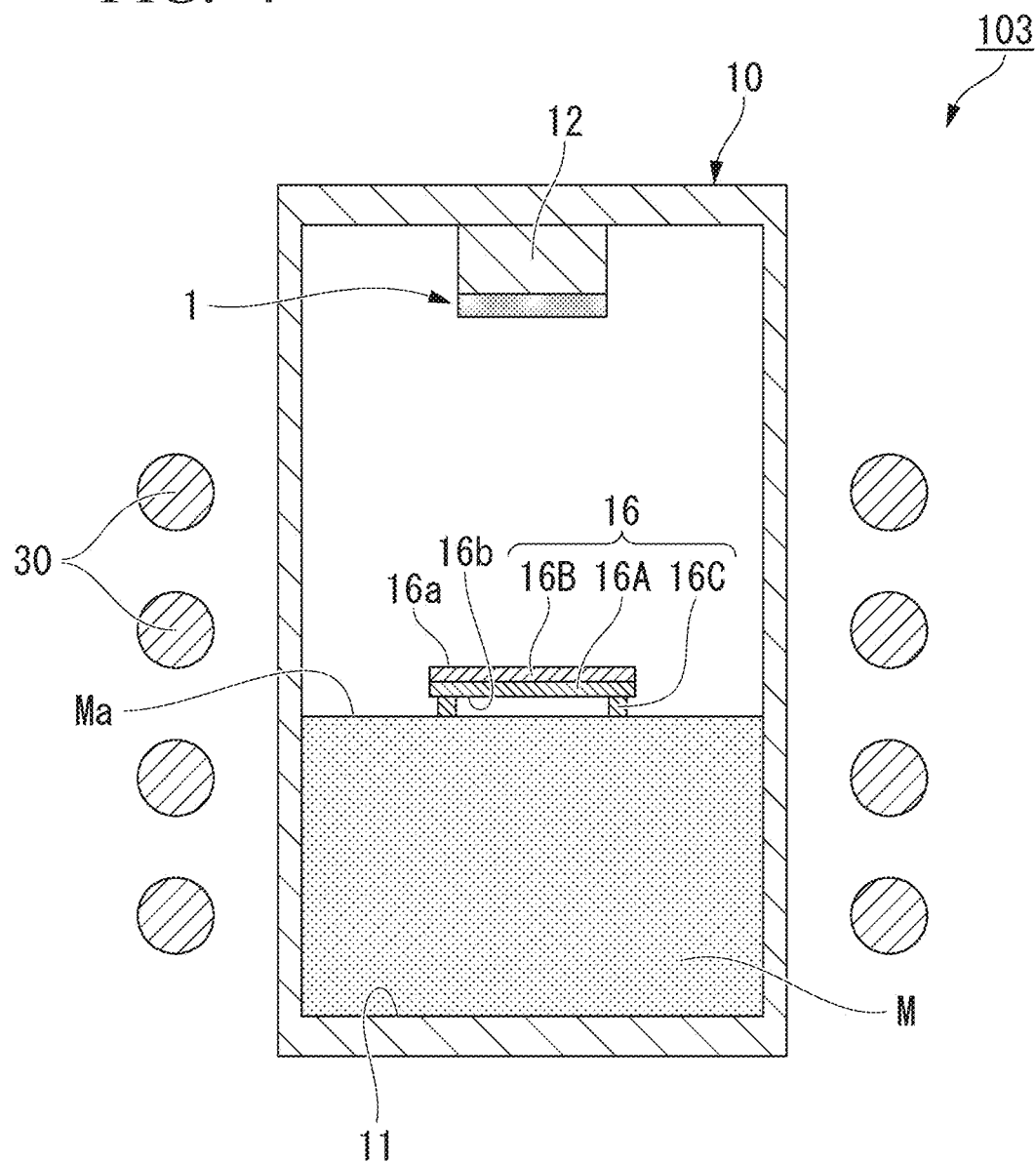
FIG. 4 is a schematic cross-sectional view of a single crystal growth apparatus according to the fourth embodiment.

FIG. 4 is a schematic cross-sectional view of a single crystal growth apparatus 103 according to the fourth embodiment. The apparatus 103 for growing a single crystal shown in FIG. 4 is different from the single crystal growth apparatus 100 shown in FIG. 1 in the structure of the deposition preventing member 16. The other configurations are the same, and the description thereof is omitted.

The deposition preventing member 16 illustrated in FIG. 4 is a member disposed on the raw material M after the raw material is provided in the inner bottom 11. The deposition preventing member 16 covers the central area of the inner bottom 11 in a plan view from the crystal mounting part 12, When the raw material M is provided in the inner bottom 11, the deposition preventing member 16 covers the central area of the raw material M. The deposition preventing member 16 may cover a wider range than the central area.

The deposition preventing member 16 shown in FIG. 4 includes a base 16A, a surface layer 16B, and a support 16C. The surface layer 16B covers at least the surface of the base 16A on the side of the crystal mounting part 12. The deposition preventing member 16 is different from the deposition preventing member 14 shown in FIG. 2 in that the deposition preventing member 16 includes the support 16C. Since the first surface 16a of the deposition preventing member 16 is made of metal carbide, it is possible to suppress recrystallization of the source gas subjected to sublimation on the deposition preventing member 16.

The support 16C is provided on a second surface 16b opposed to the first surface 16a of the deposition preventing member 16. The support 16C separates the raw material surface Ma from the second surface 16b. By providing a space between the material surface Ma and the second surface 16b, it is possible to prevent retention of the sublimated source gas and to suppress recrystallization of the material below the deposition preventing member 16.

It is preferable that the first surface 16a at the side of the crystal mounting part 12 of the deposition preventing member 16 exist in the area within 20 min from the raw material surface Ma. When the space between the raw material surface Ma and the second surface 16b is wide, a part of the raw material gas subjected to sublimation may enter this space, which may cause a deposition in the central area of the crucible 10. Therefore, the distance between the second surface 16b and the raw material surface Ma is preferably within 15 mm.

Fifth Embodiment

Figure 5:
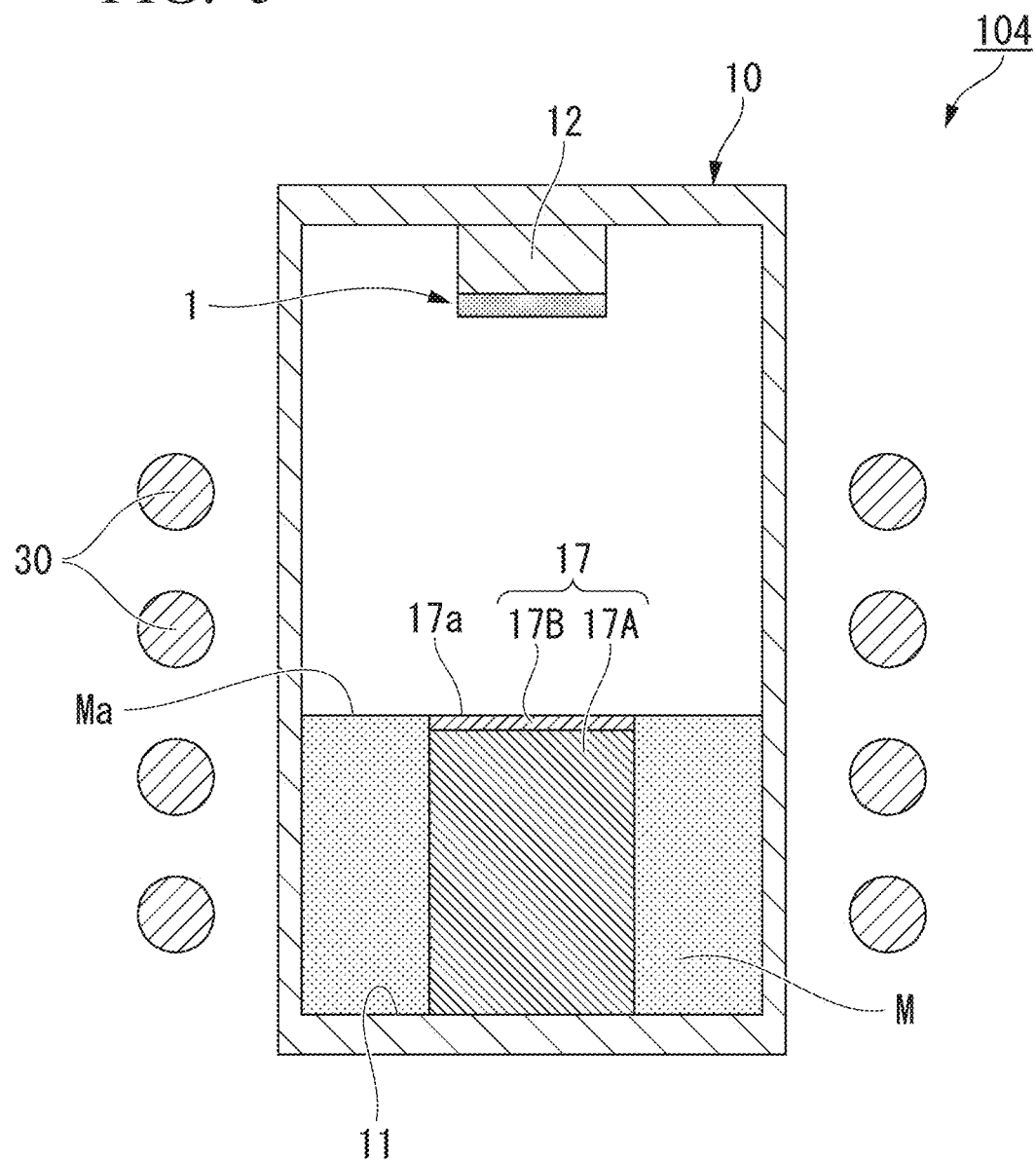
FIG. 5 is a schematic cross-sectional view of a single crystal growth apparatus according to the fifth embodiment.

FIG. 5 is a schematic cross-sectional view of the single crystal growth apparatus 104 according to the fifth embodiment. The single crystal growth apparatus 104 shown in FIG. 5 is different from the single crystal growth apparatus 100 shown in FIG. 1 in the structure of the deposition preventing member 17. The other configurations are the same, and the description thereof is omitted.

The deposition preventing member 17 shown in FIG. 5 is connected to the inner bottom 11. The deposition preventing member 17 may be integrated with the inner bottom 11.

The deposition preventing member 17 overlaps the central area of the inner bottom 11 in a plan view from the crystal mounting part 12. The deposition preventing member 17 may overlap with a wider range than the central area.

The deposition preventing member 17 shown in FIG. 5 includes a support 17A and a surface layer 17B. The surface layer 17B covers at least the surface of the support 17A on the crystal mounting part 12 side. The deposition preventing member 17 differs from the deposition preventing member 14 shown in FIG. 2 in that the support 17A is connected to the inner bottom 11. Since the first surface 17a of the deposition preventing member 17 is made of metal carbide, it is possible to suppress the source gas subjected to sublimation from being recrystallized on the deposition preventing member 17.

The first surface 17a on the crystal mounting part 12 side of the deposition preventing member 17 shown in FIG. 5 is at the same height position as the raw material surface Ma of the raw material M. The first surface 17 a does not necessarily have to be at the same height position as the raw material surface Ma, and is preferably in a range within 20 mm from the raw material surface Ma.

Since the deposition preventing member 17 is connected to the inner bottom 11, the raw material M is provided between the deposition preventing member 17 and the inner surface of the crucible 10. The raw materials located below the deposition preventing members 13, 14, 15 and 16 shown in FIGS. 1 to 4 are inhibited from sublimation by the deposition preventing members 13, 14, 15 and 16. When the deposition preventing member 17 and the inner bottom 11 are connected, the raw material M is not provided in the portion for which it is difficult to be sublimated, and the raw material M can be saved.

"Single Crystal Growth Method"

Sixth Embodiment

The single crystal growth method according to the sixth embodiment is a single crystal growth method using the devices 100, 101, 102, and 103 for growing a single crystal according to the first to fourth embodiments. The single crystal growth method according to the sixth embodiment includes, in the following order, a step of providing the raw material M in the inner bottom 11; a step of covering at least the surface on the crystal mounting part 12 side with the deposition preventing members 13, 14, 15 and 16 containing metal carbide in the central area of the diameter of the raw material surface Ma of the raw material NI in a plan view from the crystal mounting part 12; then, growing the single crystal placed on the crystal mounting part 12 by sublimating the raw material M by heating the raw material M.

First, the raw material M is provided in the inner bottom 11 in the providing step. For example, a powder raw material of SiC is filled in the inner bottom 11. It is preferable that the raw material surface Ma of the raw material M be leveled in order to enhance the symmetry with respect to the crystal mounting part 12.

Next, in the covering step, the deposition preventing members 13, 14, 15 and 16 are placed on the raw material M. The deposition preventing members 13, 14, 15 and 16 are provided so as to cover the central area. The deposition preventing members 13, 14, 15 and 16 may be provided to cover an area of 50% or more, or 80% or more of the inner diameter of the crucible 10 from the center at the position of the surface Ma of the raw material M. Further, it is desirable that the deposition preventing members 13, 14, 15 and 16 cover an area of which the temperature is at least 15° C. lower than the maximum temperature in the surface of the raw material.

In the covering step, it is preferable that the first surfaces 13a, 14a, 15a, 16a on the crystal mounting part 12 side of the deposition preventing members 13, 14, 15 and 16 be placed within a range of 20 mm or less from the raw material surface Ma. Moreover, when using the deposition preventing member 16 concerning the 4th Embodiment, it is preferable to space apart the second surface 16b of the deposition preventing member 16 and the raw material surface Ma.

The seed crystal 1 is placed in the crystal mounting part 12 at a position facing the raw material M. Mounting the seed crystal 1 may be performed before or after the raw material M is provided. After providing the seed crystal 1 and the raw material M, the crucible 10 is sealed.

Next, in the crystal-growing step, a current is supplied to the heating device 30. The heating device 30 generates heat, and thermal radiation from the heating device 30 heats the container 10. The raw material NI heated by the container 10 is sublimated and recrystallized on the surface of the seed crystal 1 so that the seed crystal 1 is grown.

The temperature of the central area of the container 10 is lower than the peripheral area. A portion of the sublimated source gas is likely to be recrystallized in the central area of the container 10. In the single crystal growth method according to the sixth embodiment, by providing the deposition preventing members 13, 14, 15 and 16 in the central area of the raw material M, the raw material particles used as the starting point of recrystallization are prevented from being exposed to the raw material gas. Further, the first surfaces 13a, 14a, 15a, 16a of the deposition preventing members 13, 14, 15 and 16 are made of metal carbide and it is difficult for them to adsorb SiC. Therefore, the source gas subjected to sublimation is suppressed from being recrystallized to become a deposition on the deposition preventing members 13, 14, 15 and 16. By suppressing the generation of deposition, it is possible to suppress the generation of different polytypes in the crystal-growing single crystal.

As mentioned above, although examples of preferred embodiments of the present invention have been described in detail, the present invention is not limited to this embodiment, and within the scope of the subject matter of the present invention described in the claims, various modifications and changes are possible. For example, the respective configurations of the single crystal growth crucible according to the first to fifth embodiments may be combined, and the single crystal growth crucible according to the first to fifth embodiments and the single crystal growth method according to the sixth embodiment may be combined.

EXAMPLE

Example 1

First, a crystal growth crucible in which a cylindrical internal space was provided was prepared. Then, the inner bottom of the crystal growth crucible was filled with the SiC powder as a raw material. Next, the deposition preventing member 16 (see FIG. 4) according to the fourth embodiment was placed on the filled SiC powder raw material.

In the deposition preventing member 16, the base 16A and the support 16C are made of graphite, and the surface layer 16B is made of tantalum carbide which covers the surface of the base 16A. The distance between the first surface 16a of the deposition preventing member 16 and the material surface Ma was 10 mm, and a space of 5 mm in height was formed between the second surface 16b and the material surface Ma.

Figure 6:
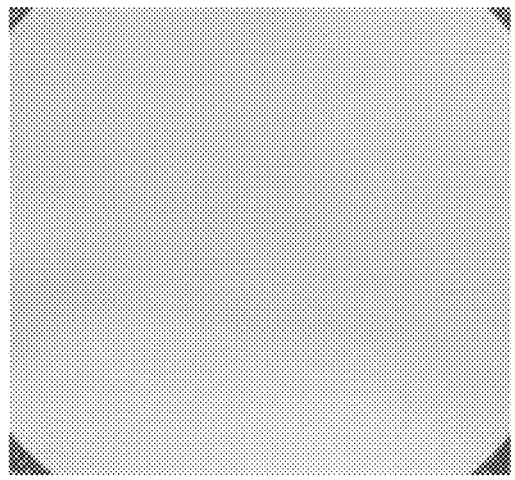
FIG. 6 is a photograph of the surface of the deposition preventing member after growing a single crystal under the conditions of Example 1.

Then, a 4H-SiC seed crystal was placed in the crystal mounting part to grow a 6-inch SiC ingot. The produced SiC ingots were all 4H-SiC, and did not contain different polytypes. FIG. 6 is a photograph of the surface of the deposition preventing member 16 after growing a single crystal under the conditions of Example 1. As shown in FIG. 6, no deposition was observed on the deposition preventing member 16.

Comparative Example 1

Comparative Example 1 differs from Example 1 in that the deposition preventing member 16 was not used. That is, the crystal growth of the SiC ingot was carried out without covering the raw material surface. The other conditions were the same as in Example 1 to carry out the crystal growth of the single crystal.

Figure 7:
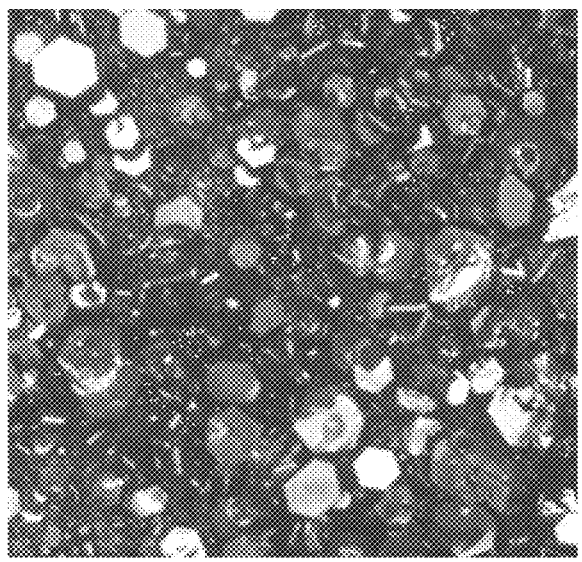
FIG. 7 is a photograph of the surface of a raw material after growing a single crystal under the conditions of Comparative Example 1.
Figure 8:
FIG. 8 is a cross-sectional photograph of the vicinity of the surface of the raw material in the central area after depositing the single crystal under the conditions of Comparative Example 1.

The produced SiC ingot contained different polytypes of 6H-SiC and rhombohedral 15R-SiC in 4H-SiC. FIG. 7 is a photograph of the surface of the raw material after growing the single crystal under the conditions of Comparative Example 1. As shown in FIG. 7, many depositions were confirmed on the surface of the raw material. FIG. 8 is a cross-sectional photograph of the vicinity of the surface of the raw material in the central area after depositing the single crystal under the conditions of Comparative Example 1. As shown in FIG. 8, it can be confirmed that recrystallization of the raw material occurs in the central area of the raw material.

Comparative Example 2

Comparative Example 2 differs from Example 1 in that the surface layer 16B of the deposition preventing member 16 was not provided. That is, in Comparative Example 2, the deposition preventing member made of graphite was mounted in the central area of the raw material. The other conditions were the same as in Example 1 to carry out the crystal growth of the single crystal.

Figure 9:
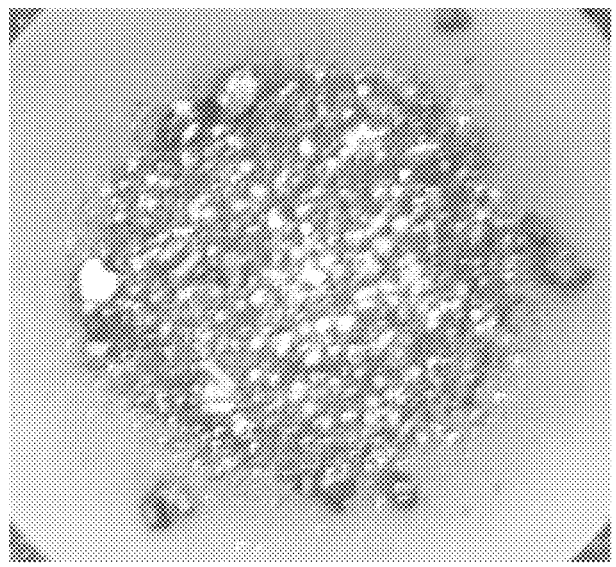
FIG. 9 is a photograph of the surface of the raw material after growing a single crystal under the conditions of Comparative Example 2.

The produced SiC ingot contained different polytypes of rhombohedral 15R-SiC in 4H-SiC. FIG. 9 is a photograph of the raw material surface after growing the single crystal under the conditions of Comparative Example 2. As shown in FIG. 9, the deposition was confirmed on the surface of the raw material, That is, in the case of graphite or the like that reacts with SiC, the effect of suppressing the depositions sufficiently cannot be obtained.

DESCRIPTION/EXPLANATION OF REFERENCES

1: Seed crystal
10: Container
11: Inner bottom
12: Crystal mounting part
13, 14, 15, 16, 17: Deposition preventing member
14A, 15A, 16A: Base
17A: Support
14B, 15B, 16B, 17B: Surface layer
16C: Support
13a, 14a, 15a, 16a, 17a: First surface
14b, 16b: Second surface
15Ab: Lower surface
30: Heating device
100, 101, 102, 103: Single crystal growth apparatus
M: Raw material
Ma: Raw material surface

What is claimed is:

1. A single crystal growth crucible, comprising:
an inner peripheral surface,
an inner bottom,
a crystal mounting part, and
a deposition preventing member,
wherein a raw material is provided in the inner bottom,
the crystal mounting part faces the inner bottom,
the deposition preventing member is located between the inner bottom and the crystal mounting part,
the whole deposition preventing member consists of metal carbide,
the crystal mounting part has a crystal mounting part surface,
a first surface of the deposition preventing member is disposed to face the crystal mounting part surface,
the raw material has a raw material surface,
the inner bottom has an inner bottom surface,
the first surface of the deposition preventing member, the crystal mounting part surface, the raw material surface, and the inner bottom surface are parallel to each other and are coaxially arranged such that a virtual straight line passes axially through a center portion of each of these surfaces,
the virtual straight line passes through a solid portion of the deposition preventing member,
the inner bottom surface has an inner bottom surface area,
the first surface of the deposition preventing member has a first surface area,
the first surface area is 80% or more of the inner bottom surface area,
the deposition preventing member has a bottom surface that is a lower-most portion of the deposition preventing member in a direction of the inner bottom surface,
the bottom surface of the deposition preventing member directly contacts the raw material and does not directly contact the inner bottom surface, and
the first surface of the deposition preventing member is an uppermost surface of the deposition preventing member, and the first surface of the deposition preventing member does not contact the inner peripheral surface of the growth crucible.

2. The single crystal growth crucible according to claim 1, wherein the first surface on the crystal mounting part side of the deposition preventing member is in a range within 20 mm from the raw material surface of the raw material.

3. The single crystal growth crucible according to claim 1, wherein the deposition preventing member is a member mounted on the raw material after the raw material is provided in the inner bottom.

4. The single crystal growth crucible according to claim 1, wherein the metal carbide is tantalum carbide.

5. The single crystal growth crucible according to claim 1, wherein the deposition preventing member is supported only by the raw material.

6. The single crystal growth crucible according to claim 5, wherein the deposition preventing member is configured to be placed on the raw material after the raw material is provided in the inner bottom.

7. A single crystal growth crucible, comprising:
an inner peripheral surface,
an inner bottom,
a crystal mounting part, and
a deposition preventing member,
wherein a raw material is provided in the inner bottom,
the crystal mounting part faces the inner bottom,
the deposition preventing member is located between the inner bottom and the crystal mounting part,
the whole deposition preventing member consists of metal carbide,
the crystal mounting part has a crystal mounting part surface,
a first surface of the deposition preventing member is disposed to face the crystal mounting part surface,
the raw material has a raw material surface,
the inner bottom has an inner bottom surface,
the crystal mounting part surface, the first surface of the deposition preventing member, the raw material surface, and the inner bottom surface are parallel to each other and are coaxially arranged in this order from a top side of the single crystal growth crucible to a bottom side of the single crystal growth crucible,
the inner bottom surface has an inner bottom surface area, the first surface of the deposition preventing member has a first surface area, the first surface area is 80% or more of the inner bottom surface area, the deposition preventing member has a bottom surface that is a lower-most portion of the deposition preventing member in a direction of the inner bottom surface, the bottom surface of the deposition preventing member directly contacts the raw material and does not directly contact the inner bottom surface, and the first surface of the deposition preventing member is an uppermost surface of the deposition preventing member, and the first surface of the deposition preventing member does not contact the inner peripheral surface of the growth crucible.

\* \* \* \* \*